United States Patent [19]
Ernst

[11] 4,068,161
[45] Jan. 10, 1978

[54] GYROMAGNETIC RESONANCE SPECTROSCOPY EMPLOYING SPIN ECHO SPIN-SPIN DECOUPLING AND TWO-DIMENSIONAL SPREADING

[75] Inventor: Richard R. Ernst, Winterthur, Switzerland

[73] Assignee: Varian Associates, Inc., Palo Alto, Calif.

[21] Appl. No.: 685,962

[22] Filed: May 13, 1976

[51] Int. Cl.² ............................................. G01R 33/08
[52] U.S. Cl. ................................... 324/.5 A; 324/.5 R
[58] Field of Search ................. 324/.5 A, .5 AC, .5 R

[56] References Cited

U.S. PATENT DOCUMENTS

| | | | |
|---|---|---|---|
| 3,529,235 | 9/1970 | Day | 324/.5 AC |
| 3,648,156 | 3/1972 | Parker | 324/.5 AC |
| 3,651,396 | 3/1972 | Hewitt | 324/.5 AC |
| 3,968,424 | 7/1976 | Ernst | 324/.5 AC |

*Primary Examiner*—M. Tokar
*Attorney, Agent, or Firm*—Stanley Z. Cole; Gerald M. Fisher; Edward H. Berkowitz

[57] ABSTRACT

A method of gyromagnetic resonance spectroscopy is disclosed which simplifies the resultant spectra by eliminating spin-spin coupling effects. The method is particularly useful for eliminating homonuclear spin-spin coupling effects. In the method, spin echo resonance of the resonators is obtained and the time elapsing between tipping of the resonators and detection of the resultant echo $t_1$ is changed from one measurement to the next. The resultant echos are measured at equal intervals of time $t_2$. Echo resonance data is Fourier transformed from the time domain into the frequency domain to obtain spectral data in the frequency domain as a function of $t_1$. A second Fourier transform of the resonance data is then effected to transform the spectral data into data which is a function of both $\omega_1$ and $\omega_2$ where $\omega_1$ and $\omega_2$ are each related to $1/t_1$ and $1/t_2$, respectively. The spectral data in the $\omega_1$–$\omega_2$ plane is then projected at 45° to the $\omega_2$ and $\omega_1$ axes to derive spectral data free of spin-spin coupling effects. The data may also be projected perpendicular to and onto the $\omega_1$ axis to obtain a J coupling spectrum.

14 Claims, 16 Drawing Figures

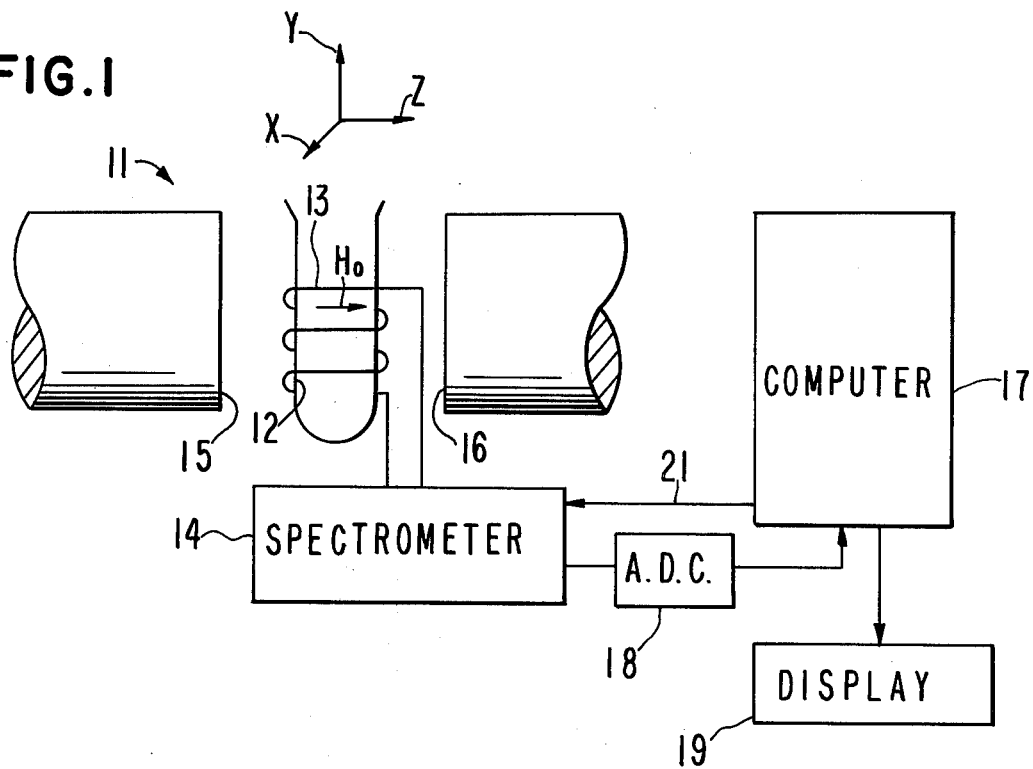
FIG.1
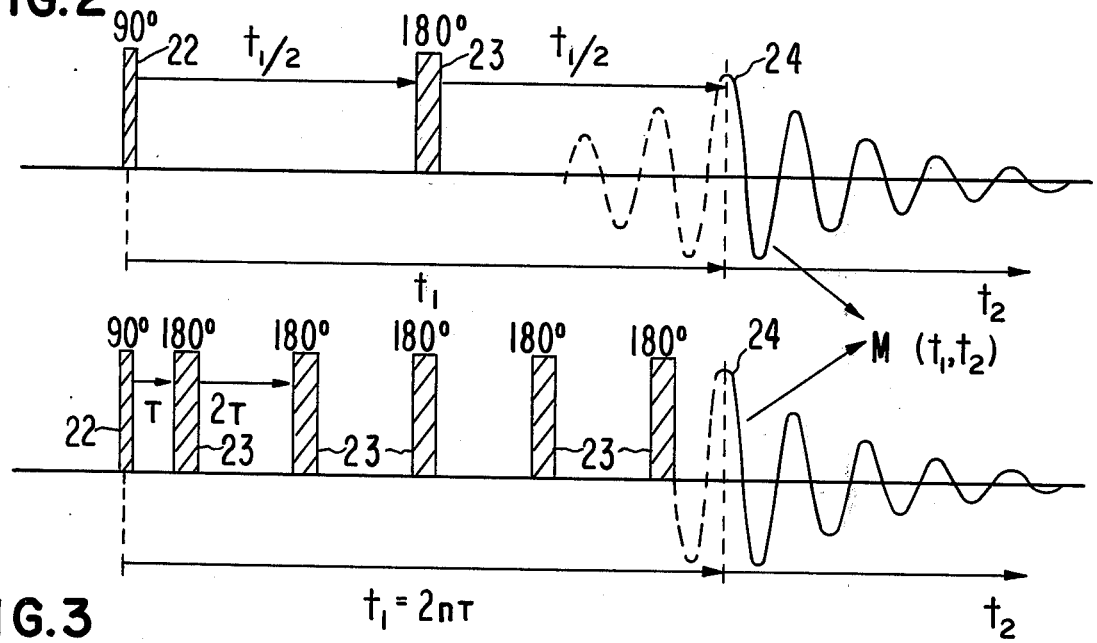
FIG.2
FIG.3

FIG. 4

$(t_2)_0$   $t_2 \rightarrow$   $(t_2)_7$ $(t_1)_0$ | $M_{00}$ .... $M_{07}$
$t_1 \downarrow$   $M_{jk}$
$(t_1)_7$ | $M_{70}$ .... $M_{77}$ $$M_{jk}(t_1,t_2) \xrightarrow{F.T.} R_{jk}(t_1,\omega_2) + I_{jk}(t_1,\omega_2)$$

FIG. 5

$\omega_2 \rightarrow$ $R_{00} I_{00} R_{01} I_{01} \cdots R_{07} I_{07}$ $t_1 \downarrow$ $R_{70} I_{70} R_{71} I_{71} \cdots R_{77} I_{77}$

FIG. 6

$t_1 \rightarrow$ $R_{00} R_{10} R_{20} \cdots R_{70}$
$I_{00} I_{10}$
$R_{01} R_{11}$
$I_{01} I_{11}$ $\omega_2 \downarrow$ $R_{07} R_{17} \cdots R_{77}$
$I_{07} I_{17} \cdots I_{77}$ $R_{jk} \longrightarrow R_{kj}$
$I_{jk} \longrightarrow I_{kj}$

FIG. 7

$\omega_1 \rightarrow$ $RR'_{00} RI'_{00} RR'_{10} RI'_{10} \cdots RR'_{70} RI'_{70}$
$IR'_{00} II'_{00} IR'_{10} II'_{10} \cdots IR'_{70} II'_{70}$ $\omega_2 \downarrow$ $RR'_{07} RI'_{07} \cdots RR'_{77} RI'_{77}$
$IR'_{07} II'_{07} \cdots IR'_{77} II'_{77}$ $$R_{kj}(t_1,\omega_2) \xrightarrow{F.T.} RR'_{kj}(\omega_1,\omega_2) + RI'_{kj}(\omega_1,\omega_2)$$
$$I_{kj}(t_1,\omega_2) \xrightarrow{F.T.} IR'_{kj}(\omega_1,\omega_2) + II'_{kj}(\omega_1,\omega_2)$$

FIG.8

$\omega_2 \rightarrow$ $\omega_1 \downarrow$ $$\begin{matrix} RR'_{00} IR'_{00} & \cdot & RR'_{07} IR'_{07} \\ RI'_{00} II'_{00} & \cdot & \cdot \\ \cdot & \cdot & \cdot \\ RR'_{70} & \cdot & \cdot \\ RI'_{70} & \cdot & \cdot \end{matrix}$$

$R_{kj} \longrightarrow R_{jk}$
$I_{kj} \longrightarrow I_{jk}$

FIG.9

$\omega_2 \rightarrow$ $\omega_1 \downarrow$ $$\begin{matrix} S^+_{00} & & S^+_{07} \\ & & \\ S^+_{70} & & S^+_{77} \end{matrix}$$

$|S^+|_{jk} = 1/2 \left[ (IR'_{jk} - RI'_{jk})^2 + (RR'_{jk} + II'_{jk})^2 \right]^{1/2}$

FIG.10

$\omega_2 \rightarrow$ $\omega_1 \downarrow$ $$\begin{matrix} S^-_{00} & & S^-_{07} \\ & & \\ S^-_{70} & & S^-_{77} \end{matrix}$$

$|S^-|_{jk} = 1/2 \left[ (IR'_{jk} + RI'_{jk})^2 + (RR'_{jk} - II'_{jk})^2 \right]^{1/2}$

PROJECTED SPECTRUM

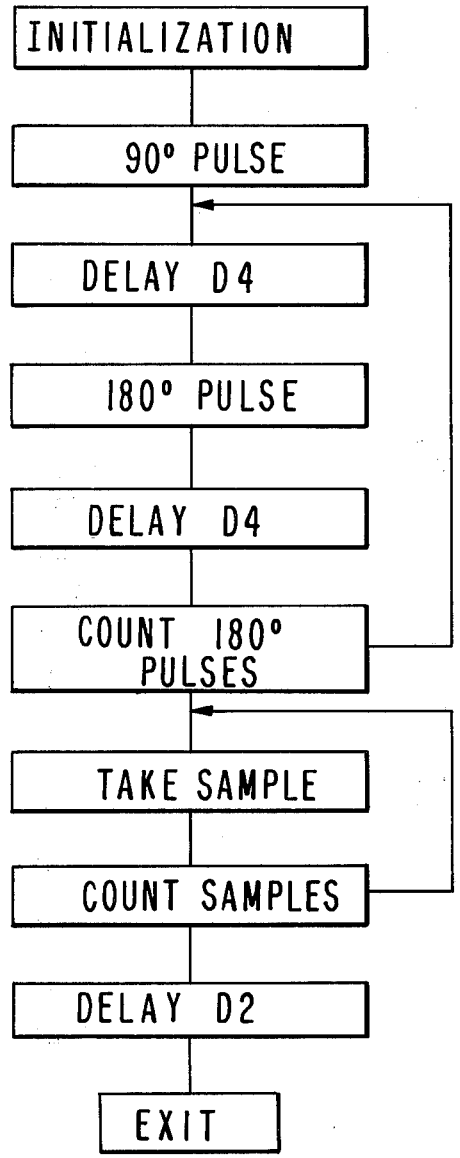
FIG. 15    ECHO-TRAIN SUBROUTINE

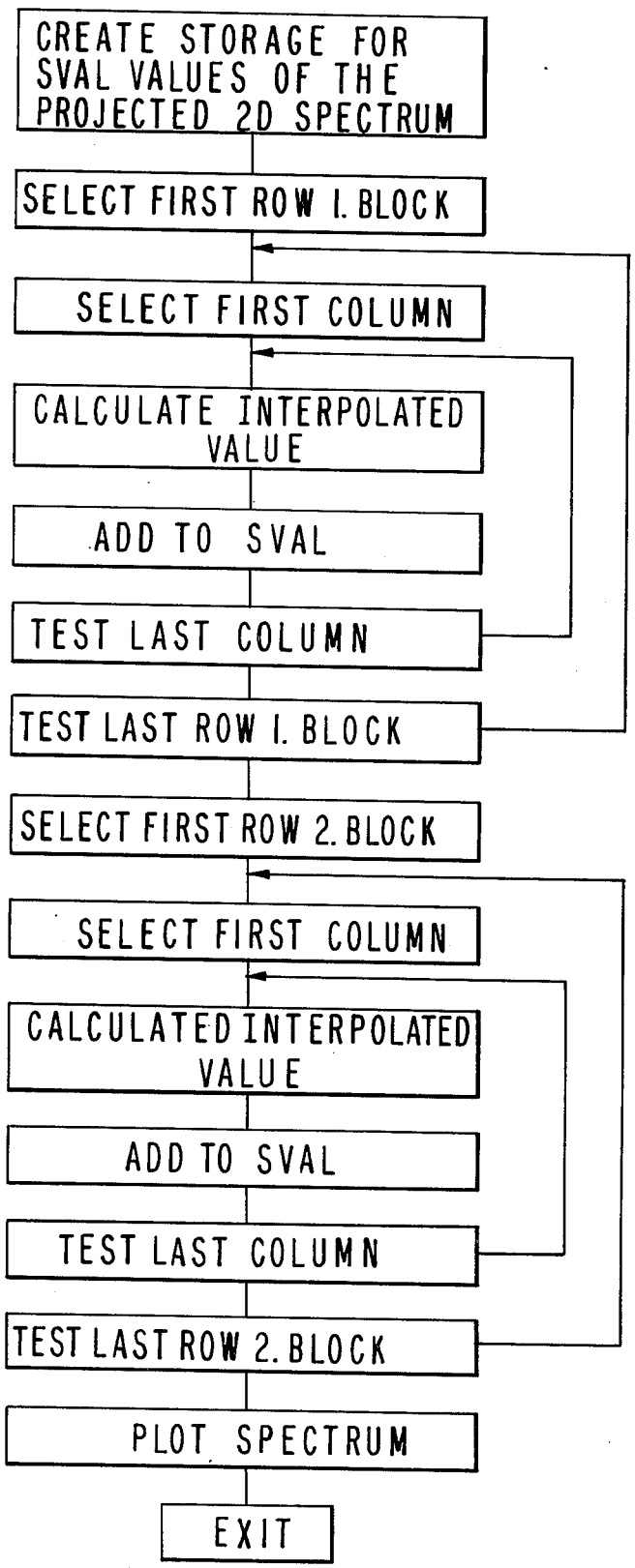

GYROMAGNETIC RESONANCE SPECTROSCOPY EMPLOYING SPIN ECHO SPIN-SPIN DECOUPLING AND TWO-DIMENSIONAL SPREADING

BACKGROUND OF THE INVENTION

The present invention relates in general to gyromagnetic resonance spectroscopy and more particularly to such spectroscopy employing spin echo and two-dimensional spreading techniques to obtain simplified spectra.

DESCRIPTION OF THE PRIOR ART

Heretofore, spin echo gyromagnetic resonance has been employed for obtaining a spectrum of spin-spin coupling constants which is free of magnetic field inhomogeneity effects and chemical shifts. Such a technique is disclosed and claimed in U.S. Pat. No. 3,753,081 issued Aug. 14, 1973 and assigned to the same assignee as the present invention.

It is also known to resolve the multiplet spectral structure produced by coupled gyromagnetic resonators, such as heteronuclear coupling, by inducing a train of transient free induction decay resonances and detecting, during a time $t_2$, the free induction decay resonance. A decoupling RF magnetic field is applied to excite one of the groups of resonators which is coupled to the other during the free induction decay resonance of the first group for decoupling the spins of the first and second groups. The duration $t_1$ of the decoupling effect is changed from one free induction decay resonance to the next. The detected resonance data which is a function of two time intervals, i.e., $t_1$ and $t_2$, is then double Fourier transformed into the frequency domain and displayed as a two-dimensional plot for resolving the multiplet structure of the spectra of the first group of gyromagnetic bodies. Such a resonance technique is disclosed in copending U.S. application Ser. No. 640,364 filed Dec. 15, 1975 and assigned to the same assignee as the present invention.

SUMMARY OF THE PRESENT INVENTION

The principal object of the present invention is the provision of an improved method and apparatus for performing gyromagnetic resonance spectroscopy and particularly to an improved method and apparatus for simplifying spectra by eliminating undesired homonuclear spin-spin coupling effects.

In one feature of the present invention, spin echo resonance is obtained of gyromagnetic resonance samples having homonuclear spin-spin coupling. The spin echos are detected during a time interval $t_2$ as a function of the change in the time $t_1$ between tipping of the resonators and detecting of the resonance. This results in obtaining detected resonance data which is the function of both $t_1$ and $t_2$ and from which simplified spectral data may be derived.

In another feature of the present invention, the detected resonance data which is a function of both $t_1$ and $t_2$ is double Fourier transformed into an $\omega_1$ and $\omega_2$ plane to obtain two-dimensional resonance data to facilitate resolving the multiplet structure of the spectra under analysis.

In another feature of the present invention, the double Fourier transformed resonance data in the frequency domain is projected at an angle to either the $\omega_1$ or $\omega_2$ planes in such a manner as to obtain a simplified resonance spectrum of the sample under analysis.

In another feature of the present invention, the two-dimensional resonance data, in the frequency domain and $\omega_1, \omega_2$ plane, is projected at 45° to either the $\omega_1$ or $\omega_2$ axes to derive spectral data free of spin-spin coupling effects.

In another feature of the present invention, the two-dimensional resonance data in the frequency domain is projected in the $\omega_1, \omega_2$ plane parallel to the $\omega_2$ axis onto the $\omega_1$ axis to derive a J spectrum of the sample under analysis.

Other features and advantages of the present invention will become apparent upon a perusal of the following specification taken in connection with the accompanying drawings wherein:

BRIEF DESCRIPTION OF THE DRAWINGS

FIG. 1 is a schematic drawing, partly in block diagram form, of a gyromagnetic resonance spectrometer employing features of the present invention, FIG. 2 is a plot of RF magnetic field intensity versus time depicting a method for exciting spin echo resonance of the sample under analysis, FIG. 3 is a plot similar to that of FIG. 2 depicting an alternative method for exciting spin echo resonance of the sample under analysis, FIG. 4 is a schematic line diagram depicting the storage of resonance spectral data in the memory of the computer of FIG. 1, FIG. 5 is a diagram similar to that of FIG. 4 depicting a block of resonance data after Fourier transformation thereon in accordance with the equation under FIGS. 4 and 5, FIG. 6 is a plot depicting a block of resonance data corresponding to that of FIG. 5 after inverting the matrix thereof in accordance with the equations under the block of FIG. 6, FIG. 7 is a schematic diagram depicting a block of spectral data stored in the memory of the computer of FIG. 1 and corresponding to a second Fourier transform thereof in accordance with the formulas depicted below FIG. 7, FIG. 8 is a diagram similar to that of FIG. 7 depicting inversion of the matrix of the data of FIG. 7 according to the equations depicted below FIG. 8, FIG. 9 is a schematic diagram of a block of resonance data derived from the data of FIG. 8 in accordance with the equation depicted immediately below FIG. 9, FIG. 10 is a diagram similar to that of FIG. 9 depicting a block of resonance data stored in the memory of the computer of FIG. 1 and derived from the data of FIG. 8 in accordance with the equation depicted below FIG. 10, FIG. 15 is a computer program flow chart depicting the echo train subroutine portion of the flow chart of FIG. 14, and FIG. 16 is a computer program flow chart depicting operation of the computer program for projecting the spectral data, such program being executed at the termination of the program of FIG. 14.

DESCRIPTION OF THE PREFERRED EMBODIMENTS

Figure 11:
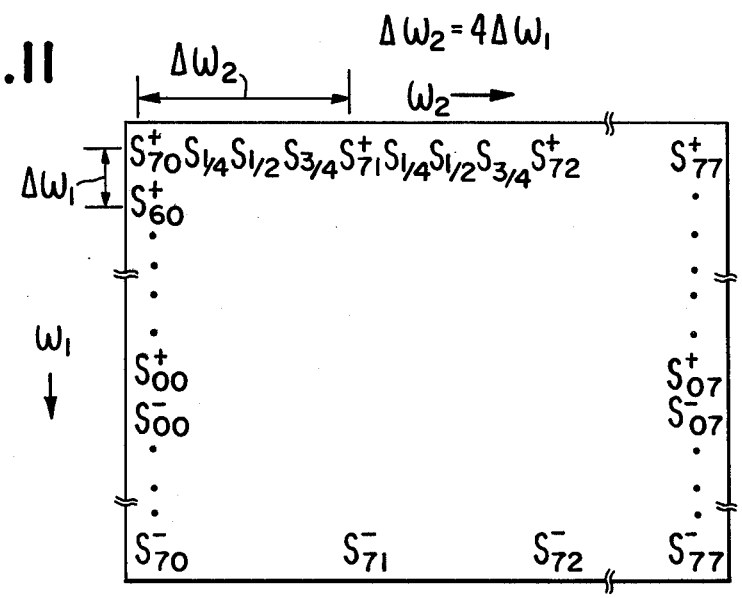
FIG. 11 is a diagram similar to those of FIGS. 9 and 10 depicting storage of the data of FIGS. 9 and 10 and interpolation thereof so as to equalize the frequency intervals in both the $\omega_1$ and $\omega_2$ directions.

Referring now to FIG. 1 there is shown a gyromagnetic resonance spectrometer 11 incorporating features of the present invention. Briefly, the spectrometer 11 includes a container 12 for containing gyromagnetic resonators such as atomic nuclei or unpaired electrons to be analyzed. In a typical example, the sample container 12 may contain relatively complex molecules such as biomolecules, enzymes, peptides, proteins or complicated organic molecules in general.

A common transmitter/receiver coil 13 is disposed coaxially surrounding the container 12, such coil being wound in axial alignment with the Y axis of the Cartesian coordinate system indicated in FIG. 1. The single transmitter/receiver coil 13 is connected to a single coil gyromagnetic resonance spectrometer 14, such as a Varian Model CFT-20 or a Bruker Model SPX 4-100.

The sample under analysis is disposed in a relatively intense unidirectional polarizing magnetic field $H_0$ produced between the pole faces 15 and 16 of a relatively large electromagnet, such as a 15 inch diameter pole face electromagnet or, in a preferred embodiment, in the field of a superconducting magnet having a magnetic field intensity corresponding to a Larmor resonance frequency of the gyromagnetic resonators in the range of 220–360MHz.

Figure 13:
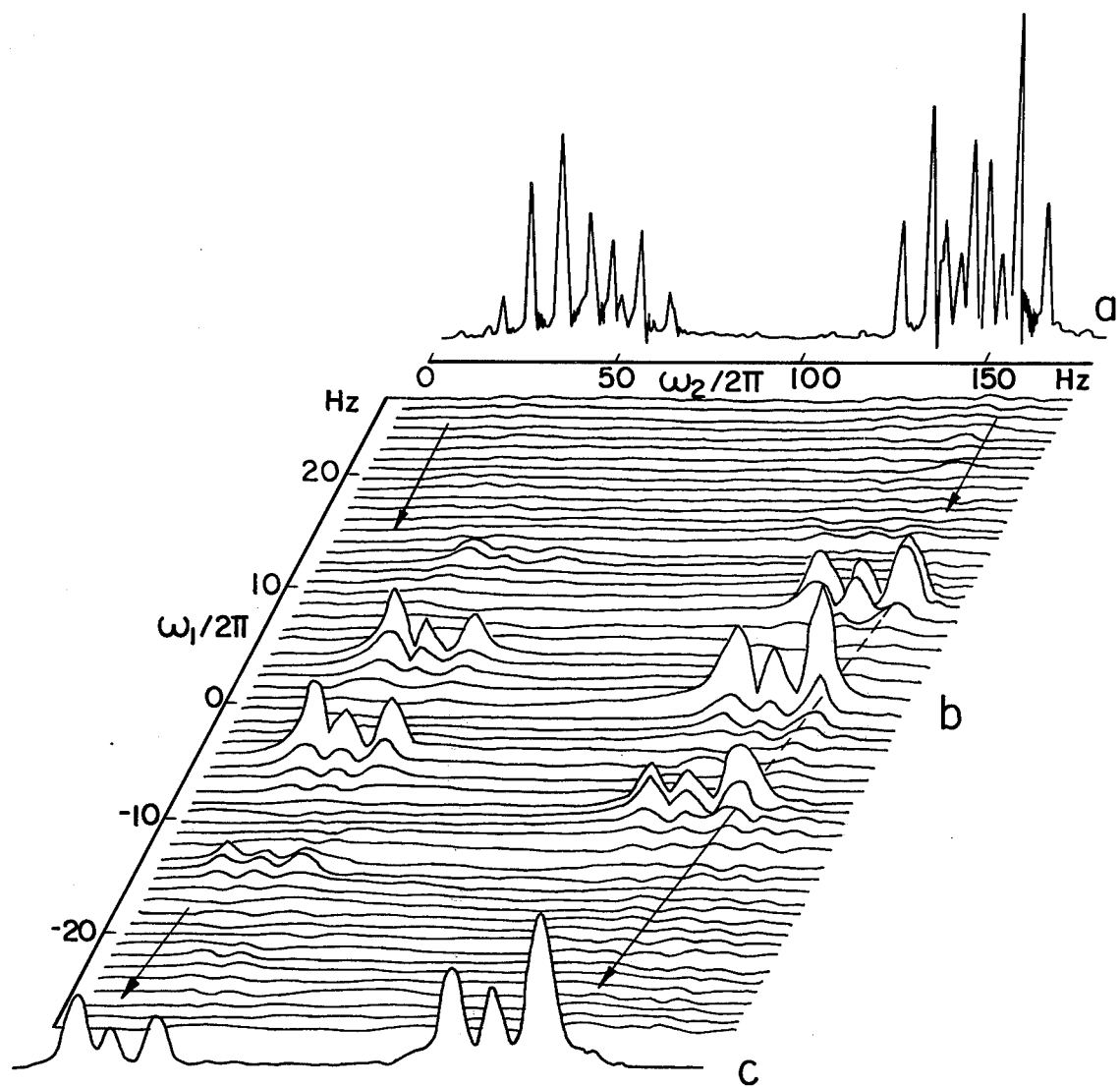
FIG. 13 is a two-dimensional display of the resonance spectral data and depicting, at waveform c, the projected spectrum derived from performing the step of FIG. 12.

The spectrometer 14 is interfaced with a digital computer 17, such as a Varian 620/L-100 having a 12K bit memory, via the intermediary of an analog-to-digital converter 18. One output of the computer is fed to a display print-out 19 for obtaining two-dimensional (2D) spectral displays of the resonance spectra of the sample under analysis. A typical 2D display is shown in FIG. 13. A synchronize and execute line 21 feeds signals from the computer 17 to the spectrometer 14 for placing the spectrometer under the control of computer 17.

In operation, the spectrometer 14 is controlled by the computer 17 in such a manner as to excite spin echo resonance of the gyromagnetic resonators within the sample. In a typical example, the gyromagnetic resonators may comprise the protons of a relatively complex hydrocarbon molecule. The spectrometer includes an internal RF transmitter which applies a pulse 22 of radio frequency magnetic field to the sample under analysis with the polarization vector of the RF magnetic field being at right angles to the direction of the polarizing magnetic field. The frequency of the radio frequency magnetic field is selected at the Larmor resonance frequency of the gyromagnetic resonators under analysis and the intensity and the duration of the applied RF magnetic field are selected so as to tip the magnetization vectors of the gyromagnetic resonators at right angles to the direction of the polarizing magnetic field. This is indicated by pulse 22 of FIG. 2. When the resonators have been tipped by 90° the RF pulse is terminated and the resonators begin to precess about the polarizing magnetic field $H_0$. After a period of time corresponding to $t_{1/2}$ a second pulse of the radio frequency magnetic field is applied with an intensity and a duration to flip the magnetization vectors of the precessing gyromagnetic resonators by 180° thereby reversing the defocusing effect of their precession about the direction of the polarizing magnetic field $H_0$. This is indicated by pulse 23. In a time $t_{1/2}$ after the center of pulse 23 a spin echo resonance signal, resulting from application of pulses 22 and 23, will reach a maximum amplitude in the transmitter/receiver coil 13. The induced resonance signal is picked up by the transmitter/receiver coil 13 and detected by the spectrometer by sampling same at a number of equal intervals of time $t_2$ commencing after $t_1$. Thus, it is seen that at a time $t_1$ after application of the first pulse 22 the detection of the spin echo resonance signal 24 commences and the spin echo resonance signal is detected at a number of equal intervals of time $t_2$. The detected resonance data is stored in the memory of the computer 17.

As an alternative to application of a single 180° pulse 23 a succession of such pulses may be employed, as indicated in the method of FIG. 3, during the time interval $t_1$. In the spin echo method of FIG. 3, the first 180° pulse follows the 90° pulse by a period $\tau$ and successive 180° pulses follow the first pulse by intervals of time $2\tau$. The time $t_1$ between tipping of the magnetization vectors and detection of the spin echo 24 remains at $t_1$ which is equal to $2n\tau$.

The method of FIG. 3 has the advantage of providing better resolution because diffusion effects are compensated within the sample. However, it is slightly more complicated than the method of FIG. 2 and an additional complication in the method of FIG. 3 is that the peak amplitude of the detected spin echo resonance changes sign from a negative at the first or every odd echo to positive for every even echo. Thus, when the method of FIG. 3 is utilized it is necessary to change the sign of every second recorded echo or to change the phase of the RF transmitter pulse.

In accordance with the present invention, the detected spin echo resonance is measured at a plurality of successive time displaced intervals such as 64 intervals of $t_2$, for each value of $t_1$. Each sampled value of the detected spin echo resonance signal, for a given spin echo signal, is recorded in a corresponding location in the memory of the computer 17, as depicted in the storage data block of FIG. 4. There are then $m$ number of spin echo resonance signals recorded, there being one for each different value of $t_1$. This is indicated by each different row in FIG. 4. In a simple example consider only eight resonance data values $M_{jk}$ for each spin echo resonance signal and assume there are only eight echo signals, each corresponding to a different value of $t_1$. The resultant 64 resonance data signal values are then stored in a storage block as indicated in FIG. 4.

In the next step the resonance data, indicated by FIG. 4, is Fourier transformed from the time domain into the frequency domain with the resultant data stored in a memory block in the manner as indicated in FIG. 5. In the process of the Fourier transform of the data of the block of FIG. 4 into the block of FIG. 5, eight zero values are added to each row of the data of FIG. 4 prior to effecting the Fourier transform into the frequency domain according to the equation depicted below FIGS. 4 and 5. This permits the real and imaginary portions of the resonance spectral data to be obtained and stored in the memory block as indicated in FIG. 5.

Next, the spectral data of the memory block of FIG. 5 is inverted according to the equations at the bottom of FIG. 6 and stored in a memory block in the manner as depicted in FIG. 6.

Next, an additional equal number of zero values are added to each row of the memory block of FIG. 6. Then the data of the expanded memory block of FIG. 6 is again Fourier transformed and stored in a memory block as indicated in FIG. 7. The second Fourier transformation of the data of the expanded memory block of FIG. 6 into the data of block 7 is done in accordance with the Fourier transform equations depicted below FIG. 7.

Next, the spectral data in the frequency domain of FIG. 7 is inverted and stored in the inverted form as shown in the memory block of FIG. 8. The inversions are in accordance with the equations depicted below FIG. 8.

Next, the real and imaginary spectral data of the memory block of FIG. 8 is converted into absolute value spectral data for positive frequency values of $\omega_1$ and stored in a memory block as depicted in FIG. 9. The transformation of the positive frequency data from the memory block of FIG. 8 into the data block of FIG. 9 is in accordance with the equation below FIG. 9. In this step of the process, the memory data block is reduced to a matrix 8×8. Similarly, the negative frequency $\omega_1$ data is converted from the data of the memory block of FIG. 8 into the data of the memory block of FIG. 10 in accordance with the equation below FIG. 10.

Next, the data from the memory blocks of FIGS. 9 and 10 is combined into one memory data block with equal increments of frequency along both the $\omega_2$ and $\omega_1$ axes as shown in FIG. 11. In FIG. 11 it is assumed that the $\omega_2$ increment $\Delta\omega_2$ is four times the magnitude of the $\omega_1$ increment $\Delta\omega_1$ and therefore interpolated values $S_{1/4}$, $S_{1/2}$, $S_{3/4}$ are inserted into the rows extending in the $\omega_2$ direction so that equal increments of frequency are obtained along both the $\omega_2$ and $\omega_1$ axes. Interpolation is merely a linear interpolation between the two adjacent previously recorded signal data values. In addition, the negative $\omega_1$ frequency data is interpolated and stored in the memory block of FIG. 11. Equalizing the frequency increments along the orthogonal $\omega_1$ and $\omega_2$ axes facilitates a 45° projection of the resonance data of the block of FIG. 11.

Figure 12:
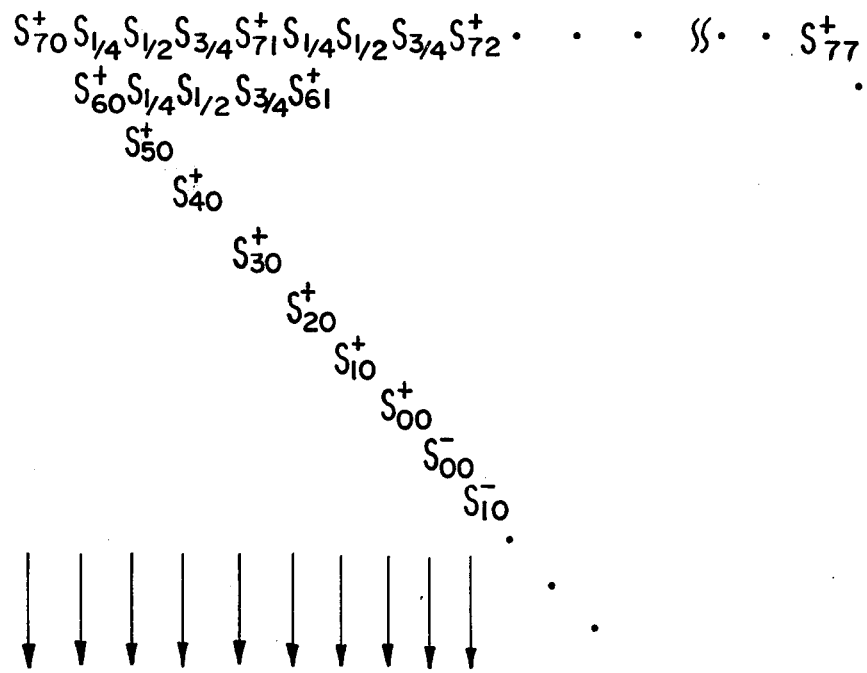
FIG. 12 is a schematic diagram similar to that of FIG. 11 depicting the step of projecting the spectral data of FIG. 11 at an angle of 45° to the $\omega_2$ axis.

The projection, which is the next step, is shown in FIG. 12 and is readily accomplished by shifting the data of successive rows in the $\omega_1$ direction to the right by one increment. The projection is obtained by summing in the $\omega_1$ direction the various signal values for a given column. The projected sums are then displayed along the $\omega_2$ axis to obtain a greatly simplified resonance spectrum as shown by waveform c of FIG. 13. Waveform c is a spectrum free of spin-spin multiplet structure. Waveform a of FIG. 13 shows the resonance data spectrum as obtained with all of the spin-spin coupling effects present and corresponding to a projection of the spectral data of the memory block of FIG. 11 onto the $\omega_2$ axis. The coupled spectrum (a) shows six chemically shifted groups with each group split into overlapping multiplet lines due to homonuclear spin-spin coupling. The plot of FIG. 13 is an isometric projection and display of the resonance data in the block of FIG. 11.

In a next step, the resonance data of the block of FIG. 11 is projected onto the $\omega_1$ axis by summing the values of each row onto the $\omega_1$ axis to obtain a J coupling spectrum of the sample under analysis. The J coupling spectrum yields important and valuable data as previously disclosed in the aforecited U.S. Pat. No. 3,753,081.

In the method as above described, it may be advantageous to suppress weak background nuclear magnetic resonant signals. This can be done before the aforedescribed projections by using a rather coarse digitization of the data which suppresses weak signals. In addition, time averaging obtained during the projection smooths the digitization steps almost completely.

In addition, it is often not desirable to record complete 2D spectra of complicated molecules. This may require too much memory. Therefore, in such cases a 2D spread of only a selected spectral region is employed. This is conveniently accomplished by recording complete echos of the entire spectrum and transforming the same in the first Fourier transform step of FIG. 5. After the first Fourier transform step, the interesting spectral range is selected, stored and used in the second Fourier transformation of FIG. 7. As another alternative, an analog filter is employed to select the resonances which are of particular interest in the response. Also, the number of echos which have to be recorded to obtain sufficient resolution in the $\omega_1$ direction is rather limited due to the small range of coupling constants in the $\omega_1$ direction.

The advantage of the present invention is that it permits great simplification in the recorded spectra for purposes of analysis without losing information. The technique permits a two-dimensional spread of complicated nuclear magnetic resonance spectra, i.e., of biomolecules or synthetic polymers. At the same time, the technique permits complete homonuclear decoupling of the NMR spectra. This is particularly useful for proton spectra and has a special utility in connection with biochemical applications which are generally limited to proton spectroscopy and which spectra are particularly complicated by the numerous spin-spin couplings. The method of the present invention permits, for the first time, the operator to untangle extremely complicated spectra by means of the two dimensional spread and complete decoupling. The method of the present invention is particularly useful with regard to relatively weakly coupled spin-spin systems. Most biological applications use high-field spectrometers, i.e., superconducting high-field spectrometers in the Larmor resonance range of 220-360 megahertz. At these high-fields, most spectra are weakly coupled.

The theory behind the present invention is that echo amplitudes in spin echo experiments are not effected by the chemical shift and reflect exclusively the effects of nuclear spin-spin coupling constants and of relaxation phenomena as long as the couplings are sufficiently weak. The free decay of the individual echos, on the other hand, is governed by the complete nuclear Hamaltonian. The free decay of an echo is composed of the various magnetization vectors $M_{jk}(t_1,t_2)$. They describe the observable transverse magnetization of the resonance line $k$ in the multiplet belonging to a set $j$ of magnetically equivalent nuclei with the Zeeman frequency $\Omega_j$, $M_{jk}(t_1,t_2) = M_{jk}(0,0) \cos(\nu_{jk}t_1 + \omega_{jk}t_2) \exp(-t_1/T_{2jk} - t_2/T_{2jk}^*)$ with $\omega_{jk} = \Omega_j + \nu_{jk}$. The multiplet splitting is denoted by $\nu_{jk} = 2\pi^2 J_{jl}m_{1k}$ with the coupling constants $J_{jl}$ and the magnetic quantum numbers $m_{1k}$ of nucleus 1 · $T_{2jk}$ is the transverse relaxation time of resonance line $jk$ and $T_{2jk}^*$ includes additionally the effects of magnetic field inhomogeneity. The two time parameters $t_1$ and $t_2$ are defined in FIG. 1.

To obtain a 2D J-resolved spectrum, a complete set of echos for various $t_1$ values is recorded. A two-dimensional Fourier transformation of $M(t_1,t_2)$ produces the 2D spectrum $S(\omega_1,\omega_2)$. The contribution of the magnetization component $M_{jk}(t_1,t_2)$ to the absolute value $|S|(\omega_1,\omega_2)$ is given for $\omega_2 \geq 0$ by $|S|_{jk}(\omega_1,\omega_2) = \frac{1}{2}M_{jk}(0,0)[1/T_{2jk}^2 + (\omega_1 - \nu_{jk})^2]^{-\frac{1}{2}}[1/T_{2jk}^{*2} + (\omega_2 - \omega_{jk})^2]^{-\frac{1}{2}}$.

A 2D J-resolved spectrum of a composite sample is shown in FIG. 13 at (c). Each peak of the original spectrum (FIG. 13 at (a)) is represented by a peak with the proper intensity in the 2D plot. The selectivity along $\omega_2$ is given by the unperturbed resonance frequencies $\omega_{jk}$, whereas the spread in the $\omega_1$ direction is determined exclusively by the multiplet splitting $\nu_{jk}$. A comparison with the original spectrum shows that the multiplet resolution has been significantly enhanced, making the analysis even of very complicated patterns rather easy.

It is crucial to notice that the peaks $k$ of each multiplet $j$ lie on a straight line passing through the point $\Omega_j$ on the $\omega_2$ axis. By means of a projection of the 2D spectrum along this direction onto the $\omega_2$ axis it is now possible to obtain a completely decoupled spectrum. This is demonstrated by FIG. 13 at $c$ which clearly shows the six peaks corresponding to the six sets of nonequivalent protons in the sample. The obtained resolution is severely limited by the 64 samples used to represent the spectrum. There is no principle limitation to obtain much better resolution by using a larger data array.

It is by no means necessary to record a 2D 2D spectrum to obtain information about a particular frequency region. It is easily possible to select a narrow portion of the spectrum after the first Fourier transformation of the various echos with respect to $t_2$.

Figure 14:
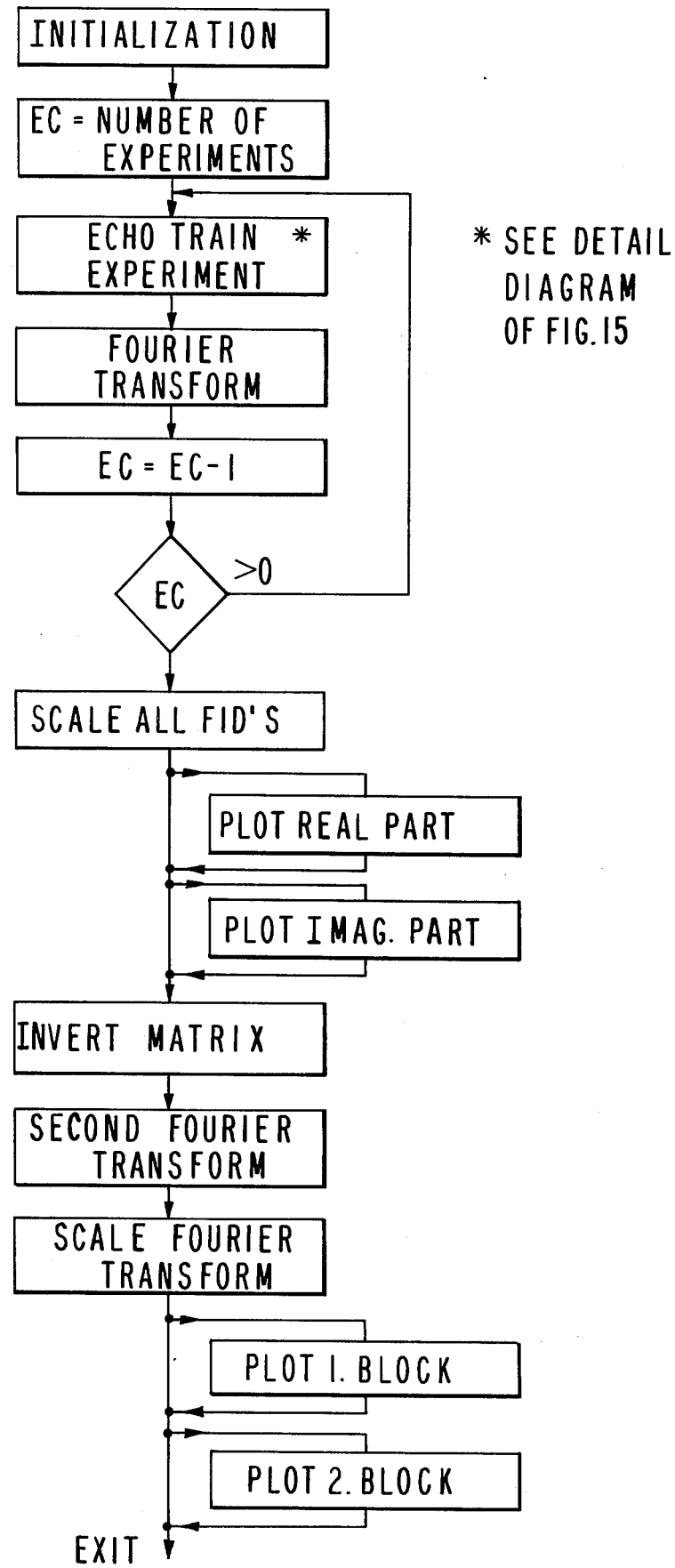
FIG. 14 is a computer program flow diagram depicting operation of the computer of FIG. 1 for carrying out the resonance method of the present invention.

A computer flow chart for the computer program is shown in FIGS. 14–16 and the suitable computer source program in Varian assembly language for use with a DAS assembler and a 620 series Varian data machine computer, commercially available from Varian Data Machines of Irvine, Calif., is an unpublished appendix to the printed specification and a copy thereof is contained in the official U.S. Patent Office file history of this patent.

What is claimed is:

1. In a method of gyromagnetic resonance spectroscopy, operative upon an assembly of first and second groups of gyromagnetic resonators immersed in a polarizing magnetic field wherein the magnetization vectors of said gyromagnetic resonators precess about said polarizing magnetic field, said first and second groups being coupled through spin-spin interaction, said spin-spin interaction causing a defocusing effect whereby the phase coherence of precession among said resonators is progressively lost, the steps of:

periodically tipping the magnetization vectors of said spin-spin coupled first and second groups of gyromagnetic resonators with respect to said polarizing magnetic field;

periodically flipping the magnetization vectors of said precessing resonators relative to the direction of the polarizing magnetic field for reversing the defocusing effect of the precession effect of the precession of said resonators about the polarizing magnetic field to obtain spin echo resonance of said resonators;

periodically detecting the spin echo resonance of said resonators; and changing the period of time $t$ between tipping of said magnetization vectors and detection of the spin echo resonance for a series of said periodically detected spin echo resonances to obtain detected gyromagnetic resonance data about said first and second spin-spin coupled groups of resonators from which to derive simplified gyromagnetic resonance spectral data.

2. The method of claim 1 wherein the step of periodically detecting the spin echo resonance of said resonators includes the step of detecting respective ones of said spin echo resonances at a plurality $m$ of time displaced intervals $t_2$ to derive sets of spin echo resonance data as a function of $n$ values of the time $t_1$.

3. The method of claim 2 including the step of Fourier transforming said sets of spin echo resonance data with respect to $t_2$ from the time domain into the frequency domain to obtain sets of spin echo resonance data in the frequency domain $\omega_2$ as a function of the time $t_1$ and as a function of $\omega_2$, where $\omega_2$ is related to $1/t_2$.

4. The method of claim 3 including the step of Fourier transforming the Fourier transformed sets of spin echo resonance data in the frequency domain with respect to $t_1$ into corresponding sets of spin echo resonances in the frequency domain as a function of the frequency $\omega_1$ which is related to the inverse of $t_1$ to obtain sets of spin echo resonance spectral data as a function of both $\omega_1$ and $\omega_2$.

5. The method of claim 4 including the steps of projecting said sets of spin echo resonance data as a function of both $\omega_1$ and $\omega_2$ onto an axis in the $\omega_1$, $\omega_2$ plane to obtain simplified gyromagnetic resonance spectral data.

6. The method of claim 5 wherein said $\omega_1$ and $\omega_2$ axes are orthogonal and wherein said projection is onto the $\omega_2$ axis along a line at approximately 45° to said $\omega_2$ axis.

7. The method of claim 5 wherein said $\omega_1$ and $\omega_2$ axes are orthogonal to each other and said projection is taken generally orthogonal to and onto said $\omega_1$ axis.

8. In a gyromagnetic resonance spectrometer, operative upon an assembly of first and second groups of gyromagnetic resonators immersed in a polarizing magnetic field wherein the magnetization vectors of said gyromagnetic resonators precess about said polarizing magnetic field, said first and second groups being coupled through spin-spin interaction, said spin-spin interaction causing a defocusing effect whereby the phase coherence of precession among said resonators is progressively lost:

means for periodically tipping the magntization vectors of said spin-spin coupled first and second groups of gyromagnetic resonators with respect to said polarizing magnetic field;

means for periodically flipping the magnetization vectors of said precessing resonantors relative to the direction of the polarizing magnetic field for reversing the defocusing effect of the precession of said resonators about said polarizing magnetic field to obtain spin echo resonances of said resonators;

means for periodically detecting the spin echo resonance of said resonators; and means for changing the period of time $t$ between tipping of said magnetization vectors and detection of the spin echo resonance for a series of said periodically detected spin echo resonances to obtain detected gyromagnetic resonance data about said first and second spin-spin coupled groups of resonators from which to derive simplified gyromagnetic resonance spectral data.

9. The apparatus of claim 8 wherein said means for periodically detecting the spin echo resonance of said resonators includes means for detecting respective ones of said echo resonances at a plurality $m$ of time displaced intervals of $t_2$ to derive sets of spin echo resonance data as a function of $n$ values of the time $t_1$.

10. The apparatus of claim 9 including means for Fourier transforming said sets of spin echo resonance data with respect to $t_2$ from the time domain into the frequency domain to obtain sets of spin echo resonance data in the frequency domain $\omega_2$ as a function of the time $t_1$ and as a function of $\omega_2$ where $\omega_2$ is related to $1/t_2$.

11. The apparatus of claim 10 including means for Fourier transforming the Fourier transform sets of spin echo resonance data in the frequency domain with respect to $t_1$ in the corresponding sets of spin echo resonance data in the frequency domain as a function of the frequency $\omega_1$ which is related to the inverse of $t_1$ to obtain sets of spin echo resonance spectral data as a function of both $\omega_1$ and $\omega_2$.

12. The apparatus of claim 11 including means for projecting said sets of spin echo resonance data as a function of both $\omega_1$ and $\omega_2$ onto an axis in the $\omega_1$, $\omega_2$ plane to obtain simplified gyromagnetic resonance spectral data.

13. The apparatus of claim 12 wherein said $\omega_1$ and $\omega_2$ axes are orthogonal and wherein said projection is taken onto the $\omega_2$ axis along a line at approximately 45° to said $\omega_2$ axis.

14. The apparatus of claim 12 wherein said $\omega_1$ and $\omega_2$ axes are orthogonal to each other and said projection is taken generally orthogonal to and onto said $\omega_1$ axis.

* * * * *